(12) United States Patent
Sun

(10) Patent No.: US 12,469,706 B2
(45) Date of Patent: Nov. 11, 2025

(54) METHOD FOR MANUFACTURING TRENCH-GATE MOSFET

(71) Applicant: Hangzhou Silicon-Magic Semiconductor Technology Co., Ltd., Hangzhou (CN)

(72) Inventor: He Sun, Hangzhou (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 554 days.

(21) Appl. No.: 17/951,543

(22) Filed: Sep. 23, 2022

(65) Prior Publication Data

US 2023/0100307 A1 Mar. 30, 2023

(30) Foreign Application Priority Data

Sep. 24, 2021 (CN) .......................... 202111121658.4

(51) Int. Cl.
*H01L 21/266* (2006.01)
*H01L 21/265* (2006.01)
*H10D 30/66* (2025.01)

(52) U.S. Cl.
CPC ...... *H01L 21/266* (2013.01); *H01L 21/26513* (2013.01); *H10D 30/668* (2025.01)

(58) Field of Classification Search
None
See application file for complete search history.

(56) References Cited

U.S. PATENT DOCUMENTS

| | | | |
|---|---|---|---|
| 2012/0153386 A1* | 6/2012 | Hirler | H10D 62/314 257/334 |
| 2020/0212218 A1* | 7/2020 | Kim | H10D 62/107 |
| 2022/0328658 A1* | 10/2022 | Yao | H10D 64/252 |

FOREIGN PATENT DOCUMENTS

CN 113782429 A 12/2021

* cited by examiner

*Primary Examiner* — Julio J Maldonado
*Assistant Examiner* — Pinaki Das
(74) *Attorney, Agent, or Firm* — Westman, Champlin & Koehler, P.A.

(57) ABSTRACT

The present disclosure relates to a method for manufacturing a trench-gate MOSFET. In the method, a first trench is formed in a first region and a second trench is formed in a second region in an epitaxial layer. A first well is formed in a bottom surface of the first trench in the first region, and a body region is formed in the epitaxial layer in the second region, simultaneously in one ion implantation process with one mask being used. Thus, the method reduces a number of masks and simplifies ion implantation processes, thereby reducing manufacturing cost.

4 Claims, 5 Drawing Sheets

METHOD FOR MANUFACTURING TRENCH-GATE MOSFET

CROSS-REFERENCE TO RELATED APPLICATION

This application claims the benefit of Chinese Patent Application No. 202111121658.4, filed on Sep. 24, 2021, which is incorporated herein by reference in its entirety.

TECHNICAL FIELD

The present disclosure relates to semiconductor devices, and more particularly to a method for manufacturing a trench-gate MOSFET.

BACKGROUND

Power semiconductor devices, also known as power electronic devices, include power diodes, thyristors, vertical double diffused metal oxide semiconductor (VDMOS) field effect transistors, lateral diffused metal oxide semiconductor (LDMOS) field effect transistors, and insulated gate bipolar transistors (IGBTs), etc. A VDMOS field effect transistor includes a source region and a drain region formed on opposite surfaces of a semiconductor substrate. Current flows along a vertical direction of the semiconductor substrate in an on state.

On the basis of the VDMOS field effect transistor, a trench-gate MOSFET is further developed. A voltage range of the trench-gate MOSFET is from 30V to 150V. A high-voltage shielded trench-gate MOSFET of 150V has a cell region and a terminal structure for meeting the high voltage requirement. A conventional process of forming the terminal structure requires additional masks and ion implantation processes. Thus, it is desirable to further simplify the manufacturing process and reduce the manufacturing cost.

SUMMARY

In view of the above problems, it is an object of the present disclosure to provide a method for manufacturing a trench-gate MOSFET, in which ions are implanted into a bottom surface of a first trench in a first region and into a surface of an epitaxial layer simultaneously to reduce a number of masks and simplify ion implantation processes, thereby reducing manufacturing cost.

According to an aspect of the present disclosure, there is provided a method for manufacturing a trench-gate MOSFET, comprising: forming an epitaxial layer of a first dopant type on a first surface of a substrate of a first dopant type; etching the epitaxial layer to form a first trench in a first region and a second trench in a second region; implanting ions into a bottom surface of the first trench in the first region to form a first well, and into a surface of the epitaxial layer in the second region to form a second well as a body region, the first well and the second well being of a second dopant type opposite to the first dopant type; forming a first insulating layer on a surface of the epitaxial layer and in the first trench and the second trench, the first insulating layer surrounding sidewall of the first trench and the second trench to form cavities in the first trench and the second trench; forming a polysilicon layer which fills the cavities, and etching back the polysilicon layer to remove a portion of the polysilicon layer in the second trench; etching back the first insulating layer to expose an upper portion of the second trench; forming a gate dielectric on an inner wall of the upper portion of the second trench, the gate dielectric covering a remaining portion of the polysilicon layer in the second trench; forming a gate conductor in the upper portion of the second trench; and forming a source region of the first dopant type in the body region.

In the method for manufacturing the trench-gate MOSFET according to the present disclosure, ions are implanted into the bottom surface of the first trench in the first region, and into the surface of the epitaxial layer in the second region. The first well is formed in the bottom surface of the first trench in the first region, and the body region is formed in the epitaxial layer in the second region, simultaneously in one ion implantation process with one mask being used. Thus, the method reduces a number of masks and simplifies ion implantation processes, thereby reducing manufacturing cost.

BRIEF DESCRIPTION OF THE DRAWINGS

The above and other objects, features and advantages of the present disclosure will become more apparent from the following description of an embodiment of the present disclosure with reference to the accompanying drawings, in which.

DESCRIPTION OF EMBODIMENTS

Figure 1:
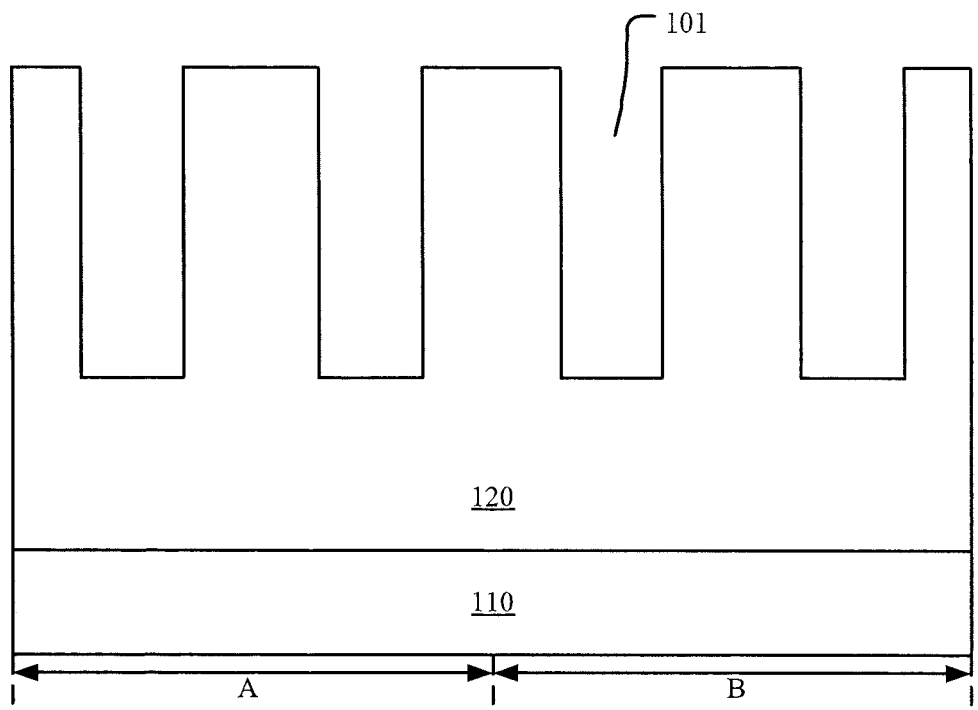
FIGS. 1 to 10 show cross-sectional views in some steps of a method for manufacturing a trench-gate MOSFET according to an embodiment of the present disclosure.

Various embodiments of the present disclosure will be described in more detail below with reference to the accompanying drawings. Throughout the various figures, like elements are denoted by the same or similar reference numerals. For the sake of clarity, various parts in the drawings are not drawn to scale. In addition, some well-known parts may not be shown. For the sake of simplicity, the semiconductor structure after several steps may be described in one diagram.

In a case that one layer or one region is referred to as being located "on" or "above" another layer or another region when a structure of a device is described, it means the one layer or the one region is located above another layer or another region, with or without additional layers or additional regions therebetween. Moreover, in a case that the device is turned upside down, the one layer or the one region will be "under" or "below" another layer or another region.

In a case that the one layer or the one region is located directly on another layer or another region, the expression will be "A is located directly on B", "A is located above and adjacent to B", "A is located above and contacts with B" or "A is located on an upper surface of B".

Specific embodiments of the present disclosure are described in further detail below, with reference to the accompanying drawings and the corresponding embodiments.

FIGS. 1 to 10 show cross-sectional views in some steps of a method for manufacturing a trench-gate MOSFET according to an embodiment of the present disclosure.

In this embodiment, the manufacturing method begins with a substrate 110 of a first dopant type. Here, the first dopant type may be an N type. The substrate 110 is a substrate of N+ type. The substrate 110 may be, but is not limited to, a silicon substrate, a silicon carbide substrate, a germanium silicon substrate, etc. Preferably, the substrate 110 is a silicon substrate. The substrate 110 includes a first region (A) and a second region (B), wherein the first region (A) is a terminal region and the second region (B) is a cell region.

Step 1: An epitaxial layer 120 is formed on the substrate 110 and trenches 101 are formed in the epitaxial layer 120, as shown in FIG. 1.

In this step, an epitaxial layer 120 of the first dopant type is epitaxially grown on a first surface of the substrate 110 by an epitaxial process. The epitaxial layer 120 covers the first surface of the substrate 110 in a first region and a second region. In this embodiment, the epitaxial layer 120 may be used as a drift region.

Further, trenches 101 are formed in the epitaxial layer 120. In this embodiment, for example, a photoresist layer is formed on a first surface of the epitaxial layer 120. The photoresist layer is patterned by photolithography to define openings of trenches. The epitaxial layer 120 is etched through the patterned photoresist layer by an anisotropic etching process to form trenches 101. Then, the photoresist layer is removed.

In this embodiment, a depth of each of the trenches 101 is less than a thickness of the epitaxial layer 120. The trenches 101 are located in the terminal region (A) and in the cell region (B), respectively.

Figure 2:
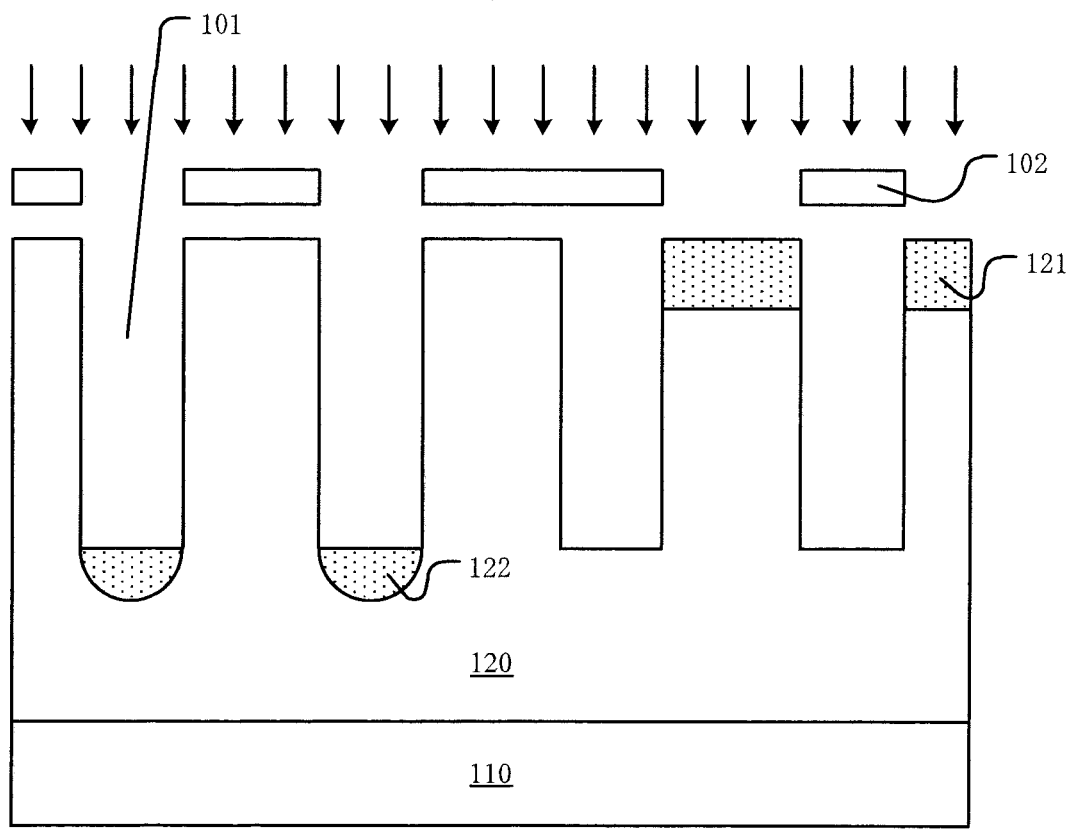

Step 2: Ions are implanted into the epitaxial layer 120 through a mask 102 to form first wells 122 and second wells 121, as shown in FIG. 2.

In this step, the mask 102 has openings which expose a portion of the epitaxial layer 120. Specifically, the openings in the mask 102 expose the trenches 101 in a first region (A) of the epitaxial layer 120, and expose a portion of the surface of the epitaxial layer 120 in a second region (B) of the epitaxial layer 120. A portion of the surface of the epitaxial layer 120 adjacent to the first region (A) and the second region (B) is blocked by the mask 102. Further, ions are implanted into the epitaxial layer 120 through the mask 102 by an ion implantation process to form first wells 122 at bottom surfaces of the trenches 101 in the first region and to form second wells 121 in the first surface of the epitaxial layer 120 in the second region.

In this embodiment, the first wells 122 and the second wells 121 are of a second dopant type, for example, P-type, opposite to the first dopant type. The first wells 122 extend from the bottom surfaces of the trenches 101 in the first region into the epitaxial layer 120.

The second wells 121 are located in a first surface of the epitaxial layer 120 between adjacent ones of the trenches 101 in the second region. The second wells 121 are, for example, body regions of the resultant device. Thus, in this step, the first wells 122 in the first region and the second wells 121 in the second region are formed simultaneously, so that an additional step of forming the body region can be omitted, thereby simplifying the manufacturing process while reducing the manufacturing cost.

Figure 3:
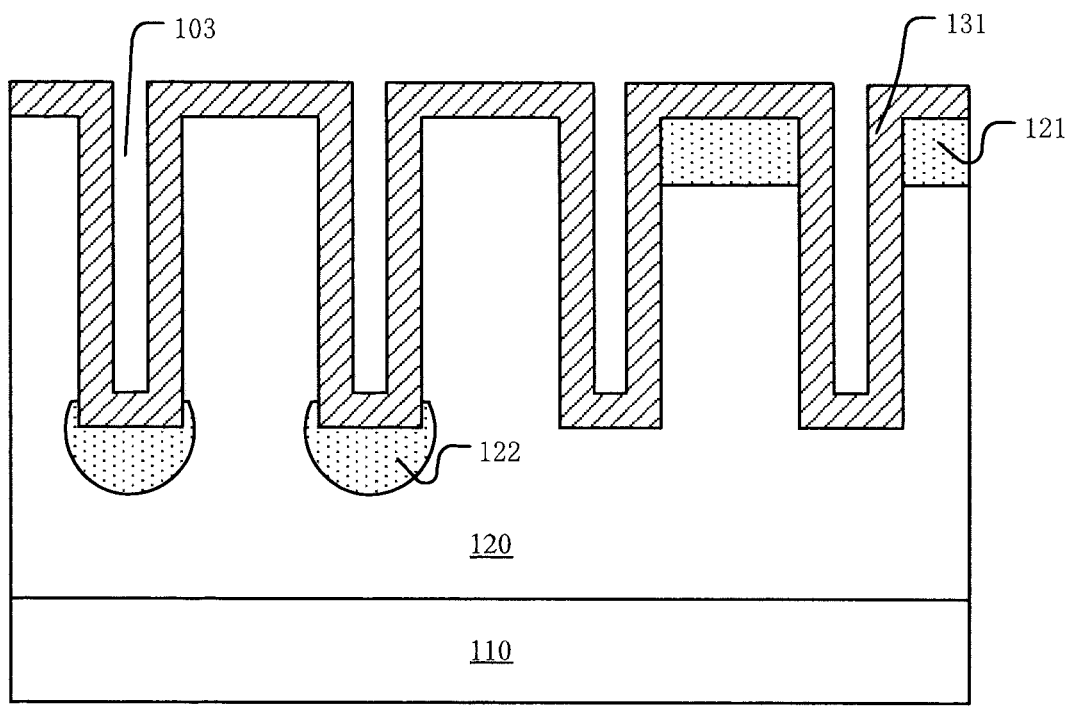

Step 3: A first insulating layer 131 is formed on the surface of the epitaxial layer 120 and in the trenches 101. The first insulating layer 131 surrounds the sidewall of the trenches 101 to form cavities 103 in the trenches 101, as shown in FIG. 3.

The first insulating layer 131 is made of an oxide, for example. The process for forming the first insulating layer 131 includes thermal oxidation or chemical vapor deposition (CVD), or a combination of both processes. Thermal oxidation includes hydrothermal oxidation (HTO) or selective reactive oxidation (SRO). Chemical vapor deposition (CVD) includes low pressure chemical vapor deposition (LPCVD) or sub-atmospheric chemical vapor deposition (SACVD).

The first insulating layer 131 is used as an isolation layer between the polysilicon layer and the epitaxial layer 120 in the power semiconductor device. The first insulating layer 131 forms on sidewalls of the trenches 101, which include side surfaces and bottom surfaces of the trenches 101, and extends above the surface of the epitaxial layer 120. The first insulating layer 131 surrounds the sidewalls of the trenches 101 to form cavities 103 in the trenches 101.

A thickness of the first insulating layer 131 may be varied for different trench-gate power semiconductor devices with different withstand voltages. Typically, the higher the withstand voltage, the larger the thickness of the first insulating layer 131 is.

Figure 8:
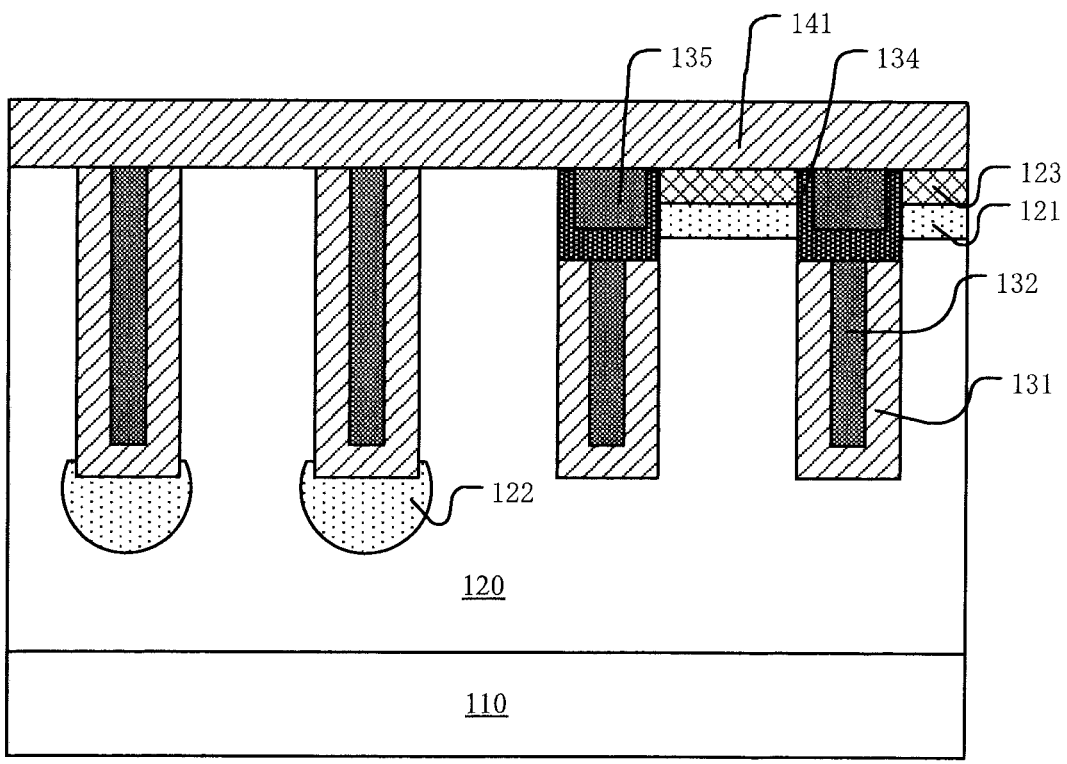
Figure 9:
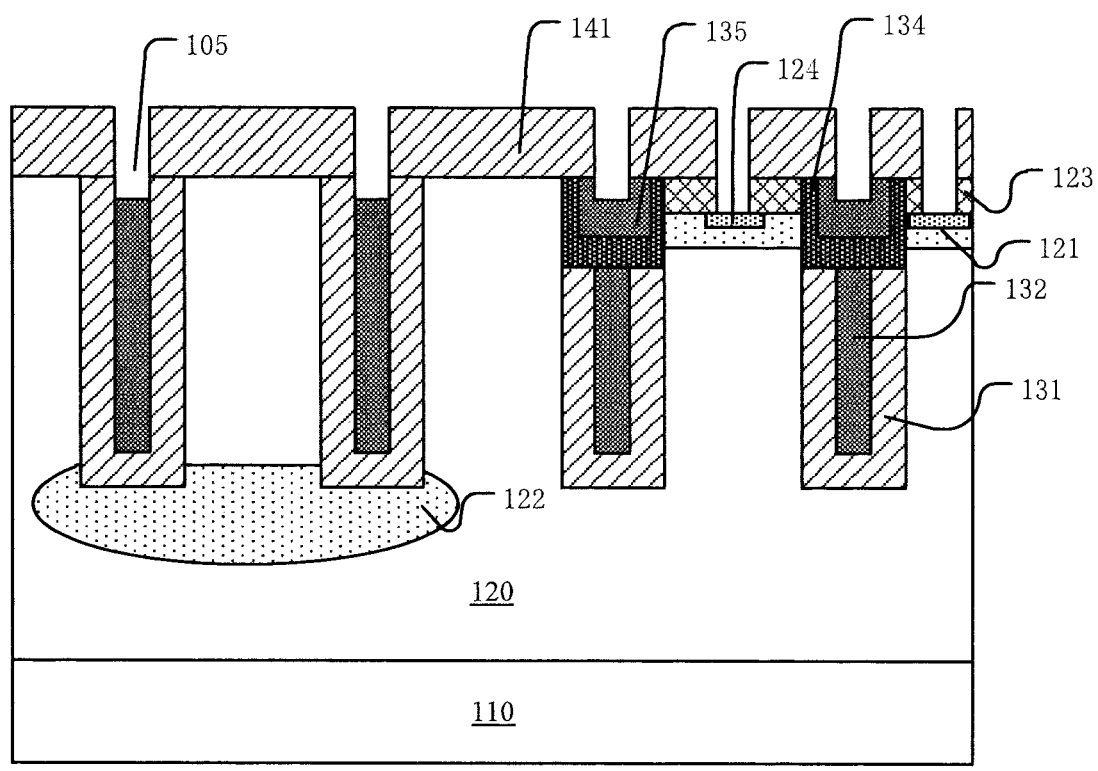
Figure 10:
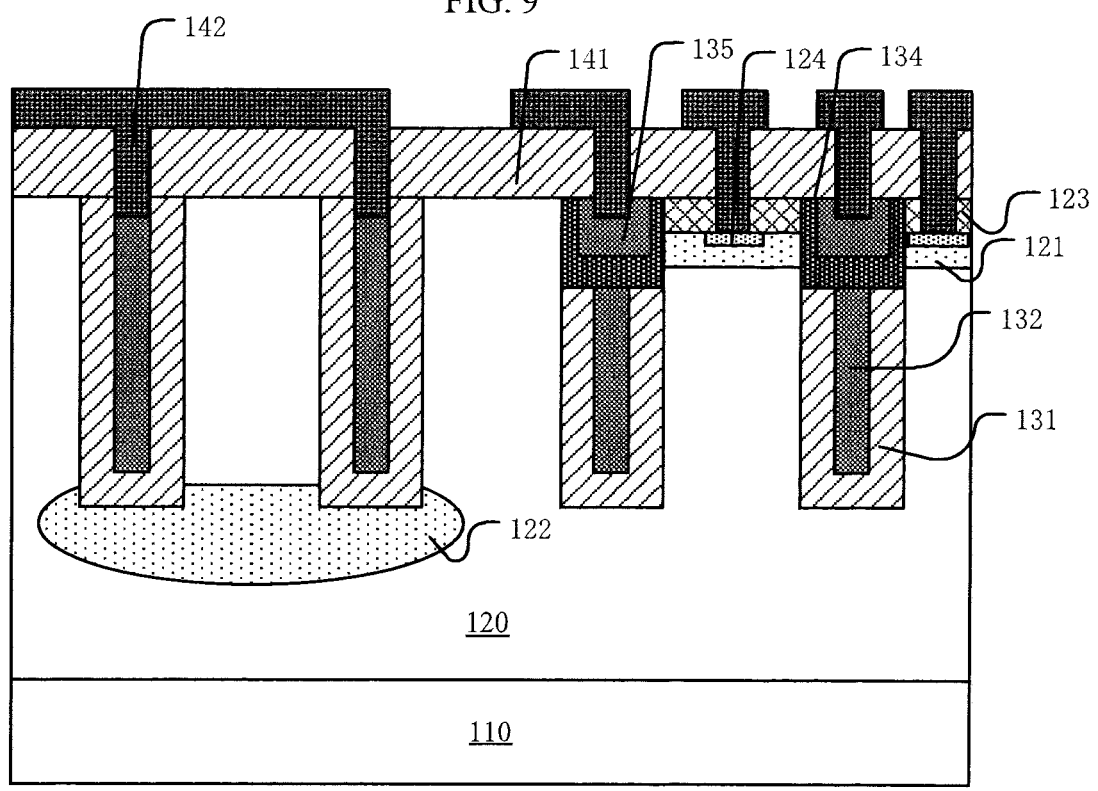

In this step, the thermal oxidation process may be used for growing the first insulating layer 131. The first wells 122 at the bottom of the trenches 101 in the first region A (i.e., the terminal region) may extend to be larger ones because the ions are diffused outwards. In the following steps, a plurality of high-temperature processes will be involved in the manufacturing method. The first wells 122 will further extend and will be merged into a continuous well, as shown in FIGS. 9 and 10, but not shown in FIGS. 4 to 8.

Figure 4:
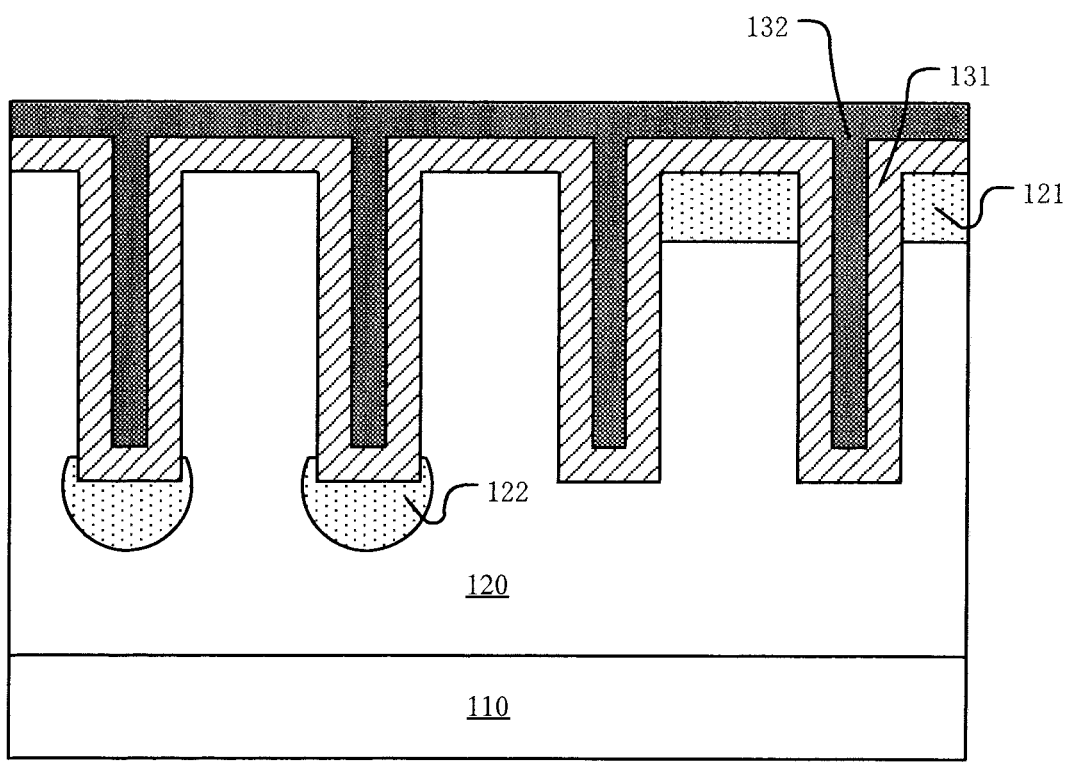

Step 4: A polysilicon layer 132 is formed in the cavities 103, as shown in FIG. 4.

In this step, a polysilicon layer 132 is formed on a surface of the first insulating layer 131 and in the cavities 103 by a deposition process. The polysilicon layer 132 includes at least one layer of polysilicon material, and fills the cavities 103 in the trenches 101.

In this embodiment, in a case that the polysilicon layer 132 is deposited in the cavities 103 for the first time but has holes or slits, the polysilicon layer 132 may be etched back and another polysilicon layer may be deposited to obtain a polysilicon layer 132 with good filling effect.

Figure 5:
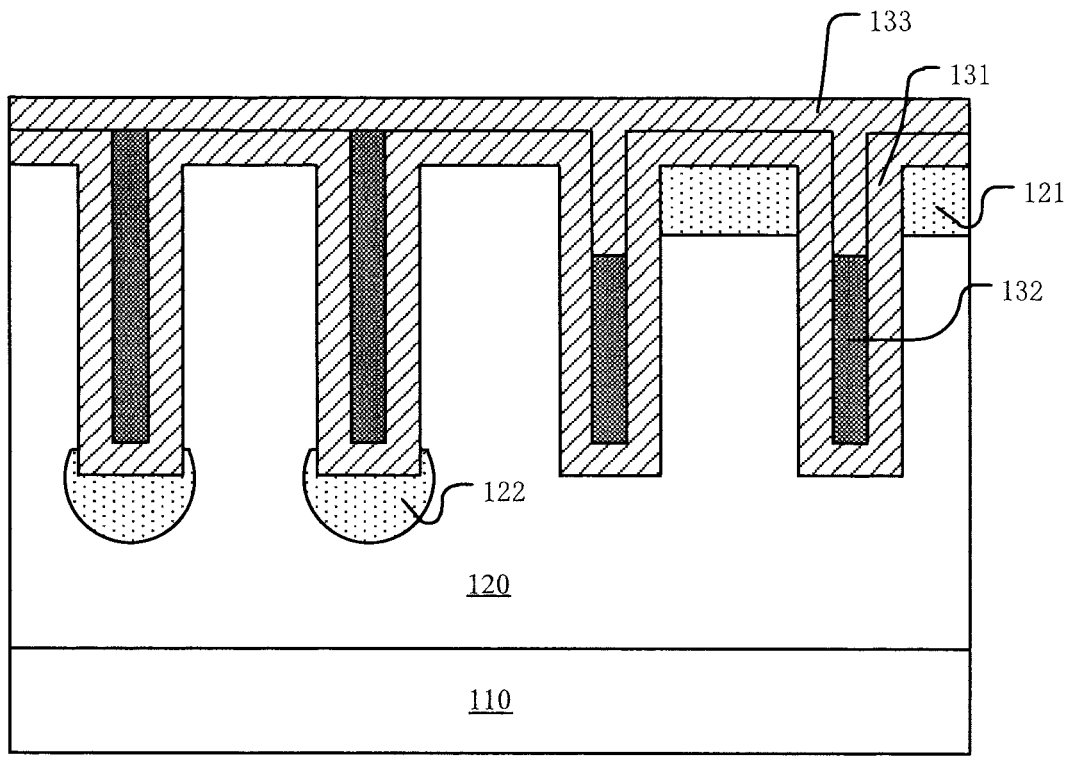

Step 5: A portion of the polysilicon layer 132 on the surface of the first insulating layer 131 is removed, and the polysilicon layer 132 in the second region is etched back, and a second insulating layer 133 is deposited, as shown in FIG. 5.

In this step, a portion of polysilicon layer 132 on the surface of the first insulating layer 131 is removed by a mechanical grinding process. The polysilicon layer 132 in the cavities 103 is etched back in the second region by an etching process, so that a portion of the polysilicon layer at upper portions of the cavities 103 in the second region is removed by etching.

Further, a second insulating layer 133 is formed on a surface of the first insulating layer 131 and at the upper portions of the cavities 103 in the second region. In this embodiment, the second insulating layer 133 is made of an oxide and fills the upper portions of the cavities 103.

Figure 6:
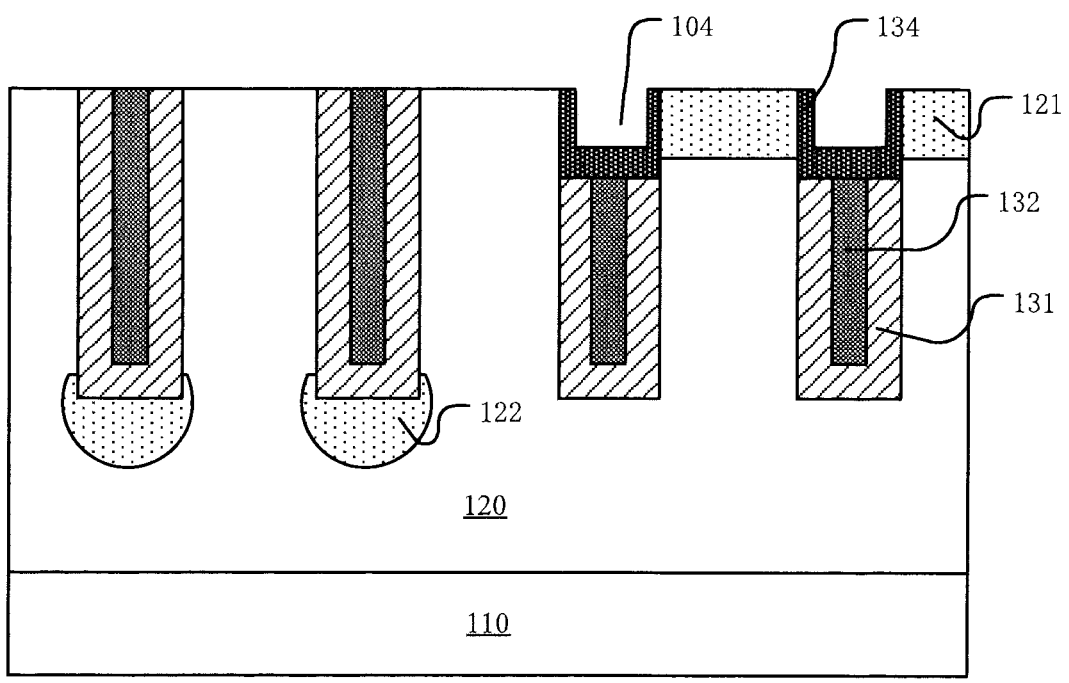

Step 6: A portion of the first insulating layer 131 and a portion of the second insulating layer 133 on the surface of the epitaxial layer 120 are removed, and a portion of the first insulating layer 131 and a portion of the second insulating layer 133 at upper portions of the plurality of trenches in the second region are etched back, and a gate dielectric 134 is formed at upper portions of the trenches 101 in the second region, as shown in FIG. 6.

In this embodiment, a portion of the first insulating layer 131 and a portion of the second insulating layer 133 on the surface of the epitaxial layer 120 are removed by, for example, a chemical mechanical grinding process. A portion of the first insulating layer 131 and a portion of the second insulating layer 133 at the upper portions of the trenches in the second region are etched back by an etching process, for example, wet etching. Thus, trenches 104 are formed at the upper portions of the trenches 101. The trenches 104 expose side surfaces of the upper portions of the trenches 101, and expose the first insulating layer 131 and the second insulating layer 133 above the polysilicon layer 132.

Further, a gate dielectric 134 is formed by growing an oxide layer by thermal oxidation, for example, on side surfaces and bottom surfaces of the trenches 104. A thickness of the gate dielectric 134 at the bottom surfaces of the trenches 104 is greater than a thickness of the gate dielectric 134 on the side walls of the trenches 104.

Figure 7:
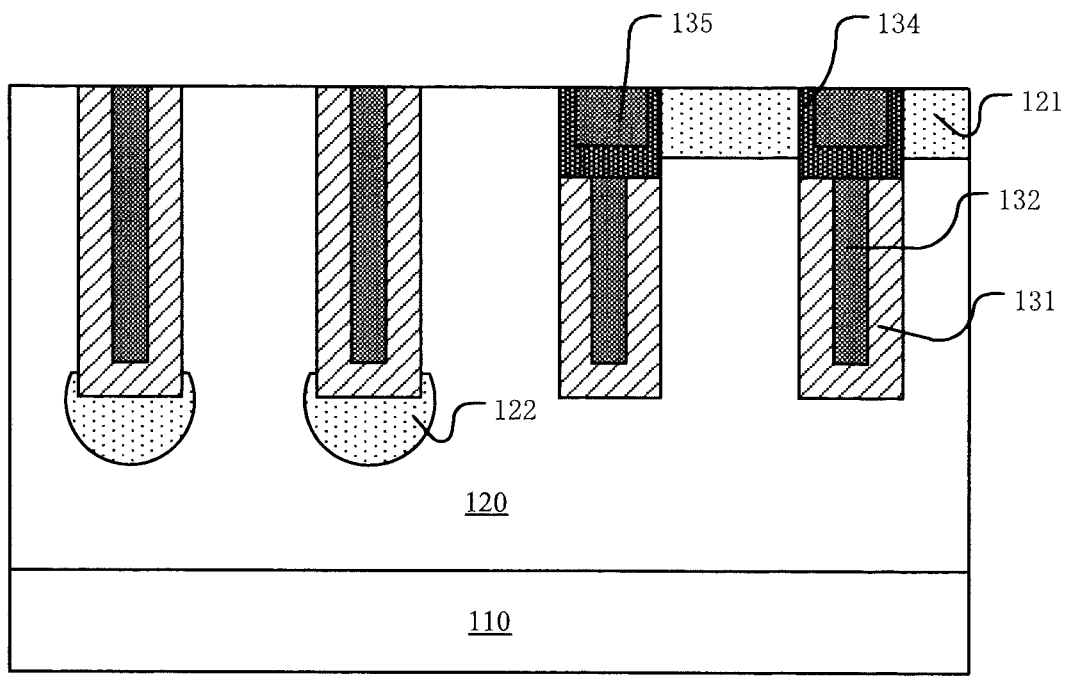

Step 7: A gate conductor 135 is formed in the trenches 104 in the second region, as shown in FIG. 7.

In this step, a gate conductor 135 is formed in the trenches 104 by a deposition process. The gate conductor 135 fills the trenches 104 and extends on the surface of the epitaxial layer 120. A chemical mechanical planarization process may be used to remove a portion of the gate conductor 135 on the surface of the epitaxial layer 120, so that the surface of the epitaxial layer 120 is exposed again. Each of the gate conductor 135 and the gate dielectric 134 has a top flush with the surface of the epitaxial layer 120.

Step 8: A source region 123 is formed below the first surface of the epitaxial layer 120 in the second region, and an interlayer dielectric 141 is formed on the first surface of the epitaxial layer 120, as shown in FIG. 8.

In this embodiment, a process for forming the source region 123 includes, for example, several times of ion implantation, by implanting ions of the first dopant type into the second wells 121 in the second region. Different dopants may be selected for forming different types of doped regions. Then, thermal annealing is carried out to activate impurities. The source region 123 is a doped region of the first dopant type, for example, an N type. In the process of ion implantation, the gate conductor 135 in the trenches defines lateral extension of the source region 123.

Further, the interlayer dielectric 141 is formed by a deposition process on the first surface of the epitaxial layer 120. The interlayer dielectric 141 covers the surface of the epitaxial layer 120 in the first region and the second region.

Step 9: Through holes 105 are formed, which penetrate the interlayer dielectric 141 and expose the polysilicon layer 132, the gate conductor 135, and the source region 123, respectively, and contact regions 124 are formed at bottom surface of the through holes 105 in the source region 123, as shown in FIG. 9.

In this step, through holes 105 are formed by an anisotropic etching process, which penetrate the interlayer dielectric 141. The through holes 105 expose the polysilicon layer 132 in the trenches in the first region, the gate conductor 135 in the trenches in the second region, and the source region 123 in the epitaxial layer 120 in the second region. Thus, the though holes 105 expose a top surface of the polysilicon layer 132 in the trenches in the first region, a middle portion of the gate conductor 135 in the trenches in the second region, and a middle portion of the source region 123 in the epitaxial layer 120 in the second region, respectively.

Further, the source region 123 or the body region 121 at the bottom of the through holes 105 are doped to be a second dopant type through some of the through hole 105 in the second region, thereby forming a contact region 124 at a lower portion of the source region 123 or at an upper portion of the body region 121.

As shown in FIG. 9, the first wells 122 at the bottom of the trenches in the first region are shown as a continuous well. This is because that a plurality of high-temperature processes will be involved in the step shown in FIG. 9 and before the step shown in FIG. 9, though no anneal process is performed for diffusing the ions. Ions in the first wells 122 are diffused outwards in the plurality of high-temperature processes and the first wells 122 are merged into the continuous well.

Step 10: A metal layer 142 is formed and then patterned, as shown in FIG. 10.

In this step, a metal is deposited on a first surface of the interlayer dielectric 141 by a deposition process, and fills the through holes 105 and extends on the first surface of the interlayer dielectric 141 to form a metal layer 142. The metal layer 142 contacts the polysilicon layer 132 in the trenches in the first region, and contacts the gate conductor 135 in the trenches in the second region, and contacts the contact region 124 in the epitaxial layer 120 in the second region, respectively. The metal layer 142 is patterned into several portions. A portion of the metal layer 142 that contacts the polysilicon layer 132 in the trenches in the first region is separated from a portion of the metal layer 142 that contacts the gate conductor 135 in the trenches in the second region and a portion of the metal layer 142 that contacts the contact region 124 in the epitaxial layer 120 in the second region.

Meanwhile, the portion of the metal layer 142 that contacts the gate conductor 135 in the trenches in the second region is separated from the portion of the metal layer 142 that contacts the contact region 124 in the epitaxial layer 120 in the second region. Consequently, the several portions of the metal layer 142 provide conductive paths to the polysilicon layer 132 in the trenches in the first region to the source region 123 in the epitaxial layer 120 in the second region, and to the gate conductor 135 in the trenches in the second region, respectively.

After a front structure of the trench-gate MOSFET is completed, a drain electrode is formed on the back surface of the trench-gate MOSFET, which is in contact with the drain region. Because the substrate 110 is used as the drain region, the drain electrode may be in direct contact with the semiconductor substrate 110 without using conducting vias.

In the method for manufacturing the trench-gate MOSFET according to the present disclosure, ions are implanted into the bottom surface of the trenches in the first region, and into the surface of the epitaxial layer in the second region. The first wells are formed in the bottom surface of the trenches in the first region, and the body region is formed in the epitaxial layer in the second region, simultaneously in one ion implantation process with one mask being used. Thus, the method reduces a number of masks and simplifies ion implantation processes, thereby reducing manufacturing cost.

The embodiments according to the present disclosure are described above, but the embodiments do not exhaust all the details and do not limit the invention to only the specific embodiments described. Obviously, according to the above description, many modifications and changes can be made. These embodiments are selected and specifically described in this specification in order to better explain the principles and practical disclosures of the present disclosure, thereby enabling those skilled in the art to make good use of the present disclosure and modifications based on the present disclosure. The present disclosure is limited only by the claims and their full scope and equivalents.

What is claimed is:

1. A method for manufacturing a trench-gate MOSFET, comprising:
   forming an epitaxial layer of a first dopant type on a first surface of a substrate of a first dopant type;
   etching the epitaxial layer to form a first trench in a first region and a second trench in a second region;
   implanting ions into a bottom surface of the first trench in the first region to form a first well, and into a surface of the epitaxial layer in the second region to form a second well as a body region, the first well and the second well being of a second dopant type opposite to the first dopant type;
   forming a first insulating layer on a surface of the epitaxial layer and in the first trench and the second trench, the first insulating layer surrounding sidewall of the first trench and the second trench to form cavities in the first trench and the second trench;
   forming a polysilicon layer which fills the cavities, and etching back the polysilicon layer to remove a portion of the polysilicon layer in the second trench;
   etching back the first insulating layer to expose an upper portion of the second trench;
   forming a gate dielectric on an inner wall of the upper portion of the second trench, the gate dielectric covering a remaining portion of the polysilicon layer in the second trench;
   forming a gate conductor in the upper portion of the second trench; and
   forming a source region of the first dopant type in the body region,
   wherein the step of implanting ions into the bottom surface of the first trench in the first region to form the first well, and into the surface of the epitaxial layer in the second region to form the second well comprises:
   providing a patterned mask which shields the surface of the epitaxial layer in the first region and the second trench in the second region; and
   implanting ions on a first surface of the epitaxial layer through the patterned mask, wherein the first well is formed by the ions implanted in the bottom surface of the first trench; and
   the second well is formed by the ions implanted in the surface of the epitaxial layer.

2. The method according to claim 1, between the steps of etching back the polysilicon layer and etching back the first insulating layer, further comprising:
   forming a second insulating layer on the first insulating layer, the second insulating layer filling the cavity in the second trench.

3. The method according to claim 1, after the step of forming a source region of the first dopant type in the body region, further comprising:
   forming an interlayer dielectric on a first surface of the epitaxial layer;
   forming through holes which penetrate the interlayer dielectric, and which expose the polysilicon layer in the first region and the gate conductor and the source region in the second region, respectively;
   forming a contact region of the second dopant type in the source region via one of the through holes; and
   forming conductive vias which contact the polysilicon layer in the first region and the gate conductor and the source region in the second region, respectively.

4. The method according to claim 1, wherein the first dopant type is of an N type and the second dopant type is of a P type.

* * * * *